United States Patent
Lee et al.

(10) Patent No.: US 8,164,559 B2
(45) Date of Patent: Apr. 24, 2012

(54) GATE DRIVING CIRCUIT INCLUDING A CONTROLLER FOR CONTROLLING A THRESHOLD VOLTAGE AND DISPLAY DEVICE INCLUDING THE SAME

(75) Inventors: Gi-chang Lee, Seoul (KR); Yong-keun Lee, Yongin-si (KR); Tae-ho Jeong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 906 days.

(21) Appl. No.: 12/221,338

(22) Filed: Jul. 31, 2008

(65) Prior Publication Data

US 2009/0128476 A1    May 21, 2009

(30) Foreign Application Priority Data

Nov. 19, 2007  (KR) .......................... 10-2007-0118072

(51) Int. Cl.
G09G 3/36    (2006.01)

(52) U.S. Cl. ......................................... 345/98; 345/100

(58) Field of Classification Search ............. 345/98–100
See application file for complete search history.

(56) References Cited

U.S. PATENT DOCUMENTS

| | | | |
|---|---|---|---|
| 2005/0275614 A1* | 12/2005 | Kim et al. ...................... | 345/100 |
| 2006/0001637 A1* | 1/2006 | Pak et al. ....................... | 345/100 |
| 2006/0017686 A1* | 1/2006 | Park ............................... | 345/100 |
| 2006/0061562 A1* | 3/2006 | Park et al. ...................... | 345/204 |
| 2006/0267912 A1* | 11/2006 | Lee et al. ....................... | 345/100 |
| 2007/0217564 A1* | 9/2007 | Tobita ............................. | 377/64 |
| 2008/0036725 A1* | 2/2008 | Lee et al. ....................... | 345/100 |
| 2008/0219401 A1* | 9/2008 | Tobita ............................. | 377/79 |

* cited by examiner

*Primary Examiner* — Chanh Nguyen
*Assistant Examiner* — Long D Pham
(74) *Attorney, Agent, or Firm* — Innovation Counsel LLP (57) ABSTRACT

Embodiments of the present disclosure provide a display device having a display panel in which gate lines are formed and a gate driving circuit which is connected to the gate lines and outputs gate signals. The gate driving circuit includes a first stage, a second stage which is positioned in rear of the first stage, and a third stage which is positioned in rear of the second stage. The second stage includes a driving controller, a driver, a sustain part, and a controller.

7 Claims, 11 Drawing Sheets

GATE DRIVING CIRCUIT INCLUDING A CONTROLLER FOR CONTROLLING A THRESHOLD VOLTAGE AND DISPLAY DEVICE INCLUDING THE SAME

CROSS-REFERENCE TO RELATED APPLICATIONS

This application claims priority to Korean Patent Application No. 10-2007-0118072 filed on Nov. 19, 2007 in the Korean Intellectual Property Office, the disclosure of which is incorporated herein by reference in its entirety.

BACKGROUND

1. Field of Invention

The present invention relates to a gate driving circuit and a display device including the same.

2. Description of Related Art

A liquid crystal display (e.g., a flat panel display device) includes a display panel having a plurality of gate wirings and a plurality of data wirings arranged across the gate wirings. The liquid crystal display includes a gate driver connected to the gate wirings that applies gate signals, and a data driver applies data voltages to the data wirings in synchronization with the gate signals.

Conventionally, the gate driver and the data driver are provided as a chip mounted on a printed circuit board (PCB) and connected to the display panel. Alternatively, the chip may be directly mounted on the display panel.

In a gate driver that does not require high mobility of a thin film transistor channel, the gate driver may be formed in a peripheral area on the display panel while forming a display cell array, without forming it in a separate chip type. In this case, the gate driver includes a plurality of thin film transistors.

In some cases, the thin film transistors in the gate driver gradually deteriorate over time, and a threshold voltage thereof may increase. Thus, a driving performance of the gate driver may decrease and durability thereof may be reduced.

SUMMARY

An embodiment of the present invention provides a gate driving circuit that actively copes with a change in a threshold voltage of a transistor and a display device including the same.

Other embodiments of the present invention are set forth in part in the description which follows and, in part, will be obvious from the description, or may be learned by practice of the present invention.

In one embodiment, the foregoing and/or other embodiments of the present invention may be achieved by providing a display device including a display panel in which a gate wiring is formed and a gate driving circuit which is connected to the gate wiring and outputs a gate signal. The gate driving circuit includes a first stage, a second stage electrically coupled to the first stage, and a third stage which is electrically coupled to the second stage. The second stage includes a driving controller which generates a first control signal and a second control signal by gate signals applied from the first stage and the third stage, a driver which outputs a gate signal of a high level according to the first control signal and the second control signal, a sustain part having at least one sustain transistor for sustaining a gate-off voltage of the driver after the gate signal is outputted from the driver, and a controller for controlling a threshold voltage of the sustain transistor.

In one implementation, the driving controller may include a first driving controller having a control terminal to which a gate signal of the first stage is applied and an output terminal which outputs the first control signal by the gate signal applied to the control terminal and a second driving controller having an input terminal to which a gate off voltage is inputted, a control terminal to which a gate signal of the third stage is applied, and an output terminal which outputs the gate off voltage as the second control signal by the gate signal. The driver may include a first driving transistor having an input terminal to which a clock signal is inputted, a control terminal to which the first control signal and the second control signal are applied, and an output terminal which outputs the clock signal as a gate signal of a high level by the first control signal and the second control signal. The driver may include a first capacitor which is provided between the output terminal and the control terminal of the first driving transistor and bootstraps the control terminal.

In one implementation, the sustain part may include a first sustain transistor having an input terminal to which a gate off voltage is inputted, a control terminal which is connected to a predetermined second node, and an output terminal which outputs the gate off voltage to the output terminal of the first driving transistor according to a signal inputted to the control terminal. The sustain part may include a second sustain transistor having an input terminal to which a gate off voltage is inputted, a control terminal which is connected to the second node, and an output terminal which applies the gate off voltage to a first node corresponding to the control terminal of the first driving transistor according to a signal inputted to the control terminal. The sustain part may include a second capacitor which is connected between a clock terminal to which the clock signal is inputted and the second node. The sustain part may include a third sustain transistor which includes an input terminal to which a gate off voltage is inputted and an output terminal which is connected to the second node and applies the gate off voltage to the second node according to a signal inputted to a control terminal thereof.

In one implementation, the controller may include an input transistor which outputs a gate signal outputted from the first stage to a third node corresponding to the control terminal of the third sustain transistor, a third capacitor which is connected between the third node and a base voltage source terminal to which a gate off voltage is applied, and an output transistor having an input terminal to which a gate signal outputted from the first stage is inputted, a control terminal to which a gate signal of the third stage is inputted, and an output terminal which is connected to the third node. The controller may include a first stabilizing transistor having an input terminal to which a gate off voltage is inputted, a control terminal which is connected to the second node, and an output terminal which is connected to the third node.

In one implementation, the controller may include a voltage source terminal and an input transistor including an input terminal which is connected to the voltage source terminal, a control terminal to which a gate signal of the third stage is applied, and an output terminal which outputs a voltage applied from the voltage source terminal by the gate signal. The controller may include a clone transistor which is serially connected to the input transistor and has substantially the same initial threshold voltage as that of the first sustain transistor and the second sustain transistor. The controller may include an output transistor including an input terminal which is connected to a fourth node corresponding to the output terminal of the input transistor, a control terminal to which a gate signal of the third stage is applied, and an output terminal which is connected to the second node.

In one implementation, the controller may include a second stabilizing transistor which is connected between the voltage source terminal and the input transistor and stabilizes a voltage inputted from the voltage source terminal and a fourth capacitor which is connected between the voltage source terminal and a base voltage source terminal to which a gate off voltage is applied.

In one implementation, the driver may include a second driving transistor having an input terminal to which a gate off voltage is inputted, a control terminal to which a clock signal outputted from the second node of the first stage is inputted, and an output terminal which outputs the gate off voltage as a gate signal of a low level by the clock signal.

In one implementation, the display device may include a fourth stage which is positioned in rear of the third stage, and the controller may include an input transistor having an input terminal which is connected to the voltage source terminal, a control terminal to which a gate signal of the fourth stage is applied, and an output terminal which outputs a voltage applied from the voltage source terminal by the gate signal. The controller may include an output transistor including an input terminal which is connected to a fourth node corresponding to the output terminal of the input transistor, a control terminal to which a gate signal of the fourth stage is applied, and an output terminal which is connected to the second node. The controller may include a clone transistor having an input terminal which is connected to a base voltage source terminal to which a gate off voltage is applied, a control terminal which is connected to the second node, and an output terminal which is connected to the fourth node.

In one implementation, the controller may include a second stabilizing transistor which is connected between the voltage source terminal and the input transistor and stabilizes a voltage inputted from the voltage source terminal and a fourth capacitor which is connected between the voltage source terminal and a base voltage source terminal to which a gate off voltage is applied.

In one implementation, the controller may include a voltage source terminal and a first input transistor having a voltage source terminal, an input terminal which is connected to the voltage source terminal, a control terminal to which a gate signal of the third stage is applied, and an output terminal which outputs a voltage applied from the voltage source terminal by the gate signal. The controller may include a first clone transistor comprising an input terminal to which a gate off voltage is applied, a control terminal to which the clock signal is applied, and an output terminal which is connected to an output terminal of the first input transistor. The controller may include a first output transistor including an input terminal which is connected to the output terminal of the first input transistor, a control terminal to which a gate signal of the third stage is applied, and an output terminal which is connected to a fourth node corresponding to the control terminal of the first clone transistor. The controller may include a second input transistor including an input terminal which is connected to the fourth node, a control terminal to which a gate signal of the third stage is applied, and an output terminal which outputs a clock signal applied from the fourth node by the gate signal. The controller may include a second output transistor comprising an input terminal which is connected to the output terminal of the second input transistor, a control terminal to which a gate signal of the third stage is applied, and an output terminal which is connected to the second node. The controller may include a second clone transistor including an input terminal which is connected to a base voltage source terminal to which a gate off voltage is applied, a control terminal which is connected to the second node, and an output terminal which is connected to a fifth node corresponding to the output terminal of the second input transistor.

In one implementation, the sustain part may include a fourth transistor having an input terminal to which a gate off voltage is applied, a control terminal to which a gate signal of the third stage is applied, and an output terminal which applies the gate off voltage to the output terminal of the first driving transistor according to the gate signal.

The foregoing and/or other embodiments of the present disclosure may also be achieved by providing a gate driving circuit having a first stage, a second stage which is electrically coupled to the first stage, and a third stage which is electrically coupled to the second stage. The second stage includes a first driving controller which generates a first control signal by a gate signal applied from the first stage, a second driving controller which generates a second control signal by a gate signal applied from the third stage, a driver which outputs a gate signal of a high level according to the first control signal and the second control signal, a sustain part comprising at least one sustain transistor for sustaining a gate-off voltage of the driver after the gate signal is outputted from the driver, and a controller for controlling a threshold voltage of the sustain transistor.

BRIEF DESCRIPTION OF DRAWINGS

The above and/or other embodiments of the present invention will become apparent and more readily appreciated from the following description of the exemplary embodiments, taken in conjunction with the accompanying drawings, in which.

DETAILED DESCRIPTION

Reference will now be made in detail to the embodiments of the present disclosure, examples of which are illustrated in the accompanying drawings, wherein like reference numerals refer to like elements throughout.

Figure 1:
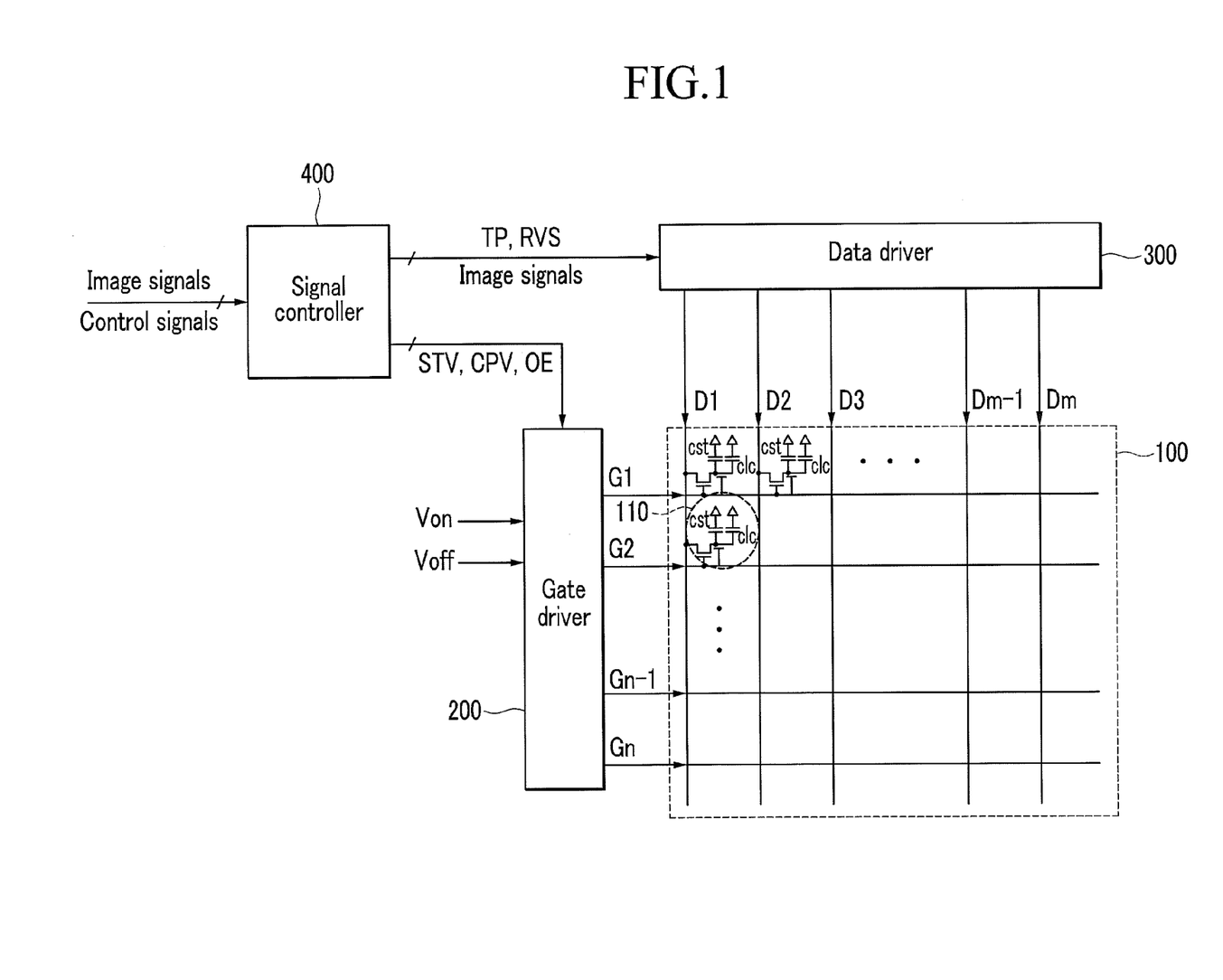
FIG. 1 is a schematic diagram of a display device according to an exemplary embodiment of the present invention.

FIG. 1 is a control block diagram of a display device according to an embodiment of the present invention. As shown, the display device includes a display panel 100, a gate driver 200, a data driver 300, and a signal controller 400. In one implementation, the display device is a liquid crystal display having a liquid crystal panel.

The display panel 100 includes, in one embodiment, two insulating substrates and a liquid crystal layer formed between two insulating substrates. A plurality of pixels 110 arranged in a matrix form are formed on the display panel 100. Each pixel 110 includes a thin film transistor T which is connected to display signal lines G1 to Gn and D1 to Dm. The display signal lines G1 to Gn and D1 to Dm include gate lines G1 to Gn for transmitting gate signals and data lines D1 to Dm for transmitting data voltages corresponding to image signals. The gate lines G1 to Gn are extended in a first direction and the data lines D1 to Dm are arranged in a second direction which is substantially perpendicular to the gate lines G1 to Gn.

Each pixel 110 further includes, in one embodiment, a liquid crystal capacitor Clc and a storage capacitor Cst which are connected to the thin film transistor T. The storage capacitor Cst may be omitted, if necessary. The thin film transistor T is formed on the lower substrate and includes a control terminal connected to a gage line G1 to Gn, an input terminal connected to a data lines D1 to Dm, and an output terminal connected to the liquid crystal capacitor Clc and the storage capacitor Cst. In one implementation, the display panel 100 includes color filters (not shown) of red, green, and blue in areas corresponding to the pixels 110 for displaying color image.

The signal controller 400 includes, in one embodiment, a control block which may be referred to as a timing controller. The signal controller 400 outputs various control signals to the gate driver 200 and the data driver 300 and processes image signals inputted from outside and outputs them to the data driver 300. The signal controller 400 outputs a vertical synchronization start signal STV, a gate clock signal CPV for controlling an output time of a gate on voltage Von, and a gate on enable signal OE for defining the width of the gate on voltage Von to the gate driver 200 as the control signals.

The signal controller 400 outputs, in one embodiment, a load signal LOAD or TP for applying data voltages corresponding to the image signals to the data lines D1 to Dm, a reverse control signal (RVS for reversing the polarity of the data voltages, and a horizontal clock signal (not shown) or the like, to the data driver 300 as the control signals. In one implementation, the signal controller 400 may include a driving signal generator generating a plurality of driving signals and a common voltage, the gate on voltage Von and the gate off voltage Voff, which are applied to the gate driver 200 and the data driver 300.

The driving signal generator may be provided as a separate element, or may be integrated with the signal controller 400. In another implementation, two or more of the signal controller 400, the gate driver 200 and the data driver 300 may be combined each other to form one chip. In one embodiment, the data driver 300, which may be referred to as a source driver, converts the image signals outputted from the signal controller 400 into analog data voltages and provides them to the pixels 110 through the data lines D1 to Dm. In one embodiment, the gate driver 200, which may be referred to as a scan driver, applies gate signals which are a combination of the gate on voltage Von and the gate off voltage Voff to the gate lines G1 to Gn.

Figure 2:
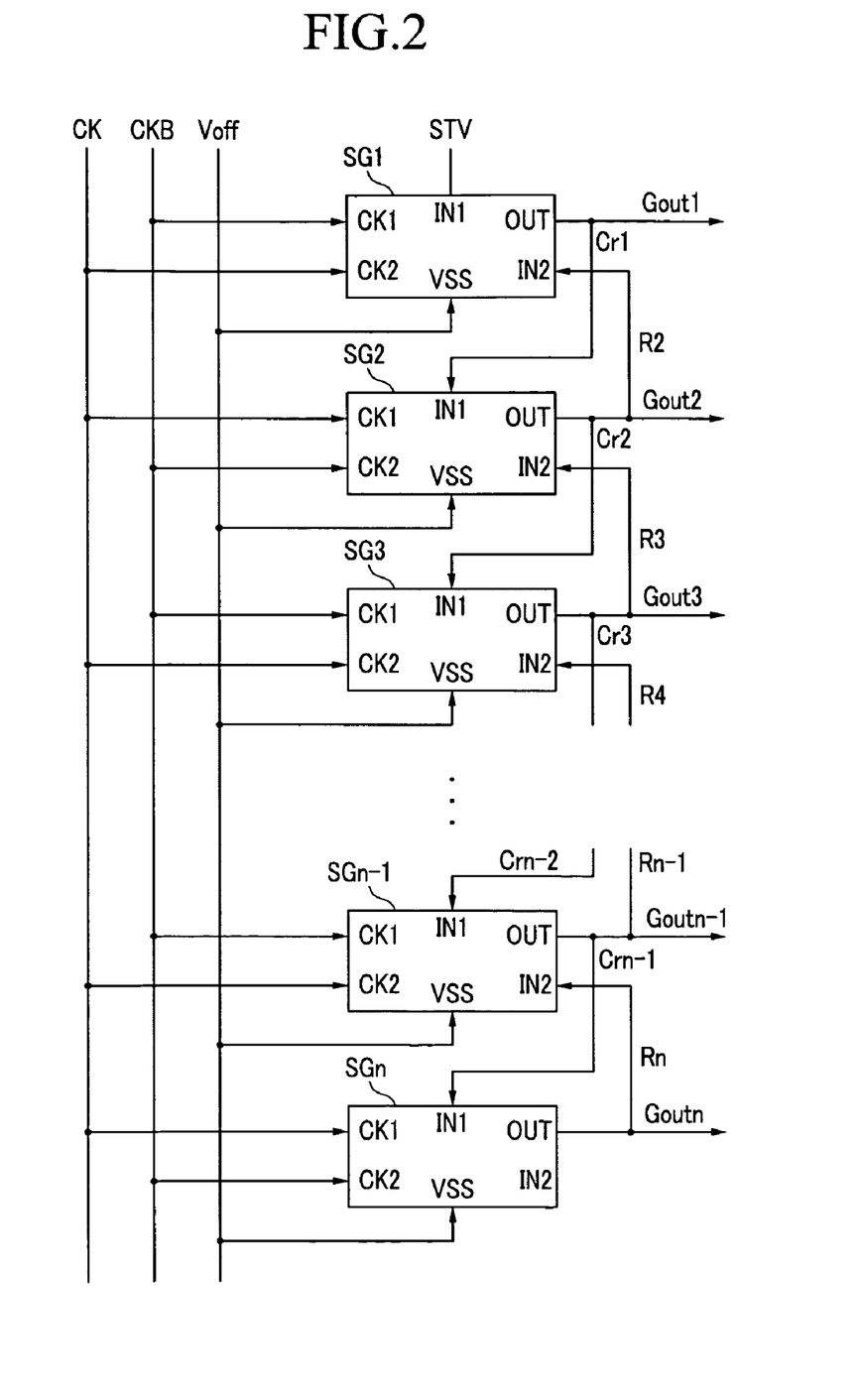
FIG. 2 is a control block diagram of a gate driver according to an exemplary embodiment of the present invention.

FIG. 2 illustrates the gate driver 200 according to one embodiment of the present invention. The gate driver 200 includes a shift register which includes stages SG1 to SGn and a plurality of signal lines connected to the stages SG1 to SGn. The stages SG1-SGn are supplied with control signals STV, CK, CKB, and Voff and output gate signals Gout1-Goutn to the gate lines G1-Gn.

Each stage SGn includes a first clock terminal CK1, a second clock terminal CK2, a first input terminal IN1, a second input terminal IN2, an output terminal OUT and a base voltage source terminal VSS.

In the stages SG1 to SGn, a connection of odd stages is described in accordance with one embodiment of the present invention. In the case of the odd stages, the first clock terminal CK1 is connected to a clock signal (CKB) line, and a second clock terminal CK2 is connected to a clock signal (CK) line. A first input terminal IN1 is connected to an output terminal OUT of the preceding stage, and a second input terminal IN2 is connected to an output terminal OUT of the following stage. The output terminal OUT is connected to a gate line G1-Gn, and a base voltage source terminal VSS is connected to a gate off voltage (Voff) line.

The clock signal CK and the clock signal CKB have stages reversed from each other, thereby, the clock signal CKB is referred to as a reversed clock signal and the line transmitting the clock signal CKB is referred to as a reversed clock signal line.

In the case of the first stage SG1 having no preceding stage, the first input terminal IN1 is connected to the vertical synchronization start signal (STV) line; and the output terminal OUT is connected to the first input terminal IN1 of the following stage.

In the even stages, a first clock terminal CK1 is connected to the clock signal (CK) line, and a second clock terminal CK2 is connected to the reverse clock signal CKB. In one implementation, connections of a first input terminal IN1, a second input terminal IN2, an output terminal OUT and a base voltage source terminal VSS are the same as those of the odd stages. In the case of nth stage having no following stage, an output terminal OUT is connected to a second input terminal IN2 of the following stage SGn−1.

However, in the first stage SG1, the first input terminal IN1 is connected to the STV instead of a gate signal Gout 2 from the next stage SG2, and in the last stage SGn, an output terminal OUT outputs only a corresponding gate line Gn and no the second input terminal IN2 is connected.

Figure 3:
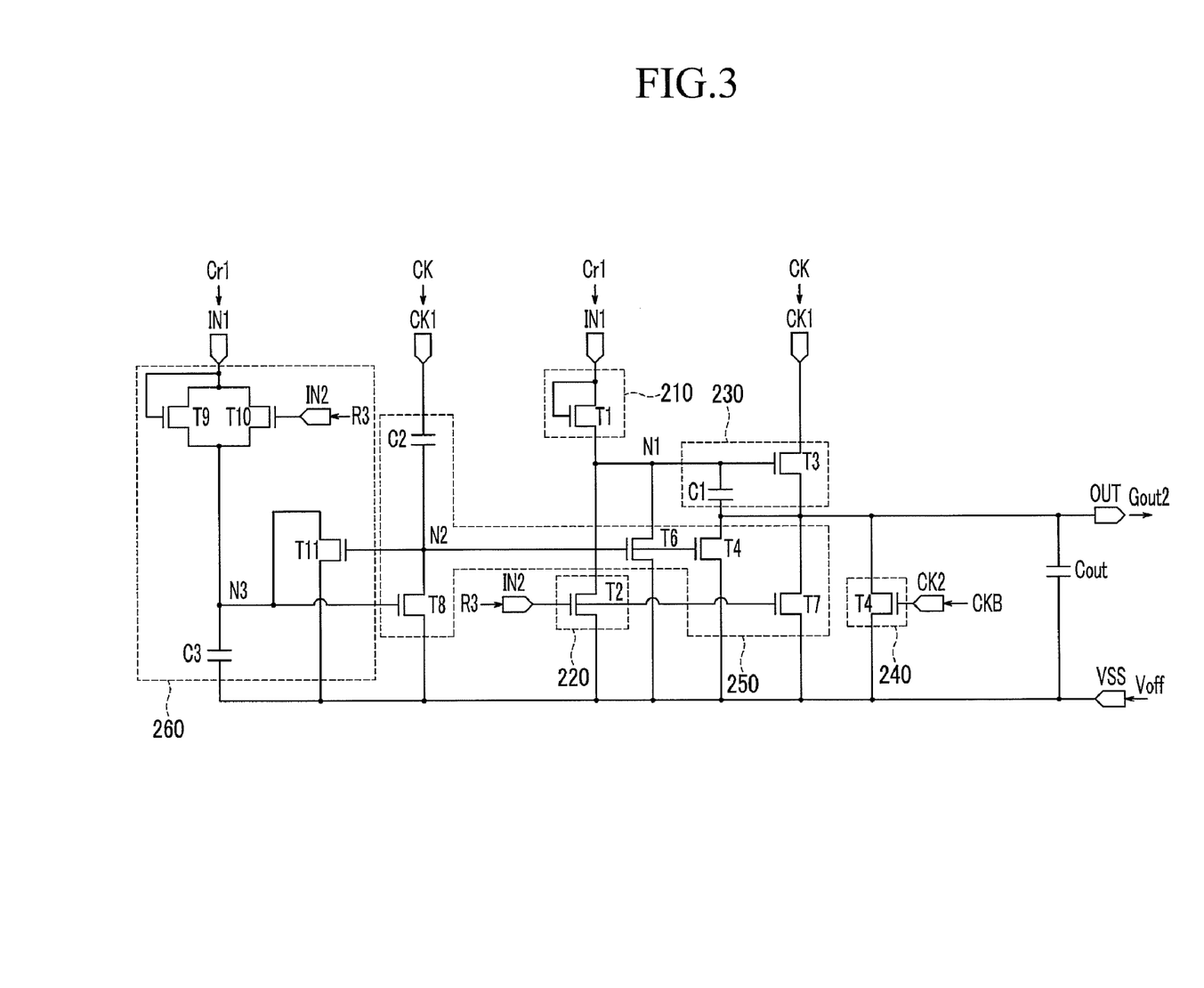
FIG. 3 illustrates a stage of the gate driver shown in FIG. 2.

FIG. 3 illustrates the stage of the gate driver shown in FIG. 2. The second stage SG2 is one of the even stages in FIG. 2. The first stage SG1 is an odd stage positioned in front of the second stage SG2, and the third stage SG3 is an odd stage positioned in rear of the second stage SG2. Hereinafter, the second stage SG2 is described by way of example. In the second stage SG2, a carry signal Cr1 is inputted from the output terminal OUT of the first stage SG1 and a reset signal R3 is inputted from the output terminal OUT of the third stage SG3. The carry signal Cr1 and the reset signal R3 correspond to gate signals Gout1 and Gout3 outputted to the output terminals OUT, respectively.

The second stage SG2 includes, in one embodiment, a first driving controller 210, a second driving controller 220, a first driver 230, a second driver 240, a sustain part 250 and a first controller 260. The first driving controller 210 includes, in one embodiment, a first thin film transistor T1. A drain electrode and a gate electrode of the first thin film transistor T1 are commonly connected to the first input terminal IN1, and a source electrode thereof is connected to a first node N1. The first driving controller 210 receives a gate signal of a high level, that is, a gate on voltage, which is a carry signal Cr1 from the preceding stage and provides a first control signal of a high level to a control terminal of the first driver 230.

The second driving controller 220 includes, in one embodiment, a second thin film transistor T2. A drain electrode and a gate electrode of the second thin film transistor T2 are respectively connected to the first node N1 and the base voltage source terminal VSS, and a gate electrode thereof is connected to the second input terminal IN2. In one implementation, the second driving controller 220 receives a gate signal of a high level from a third stage SG3 as the reset signal R3 and provides a second control signal of a low level to the control terminal of the first driver 230.

The first driver 230 corresponds, in one embodiment, to a pull-up driver and includes a first driving transistor T3 and a first capacitor C1. A drain electrode and a source electrode of the first driving transistor T3 are respectively connected to the first clock terminal CK1 and an output terminal OUT and a gate electrode thereof is connected to the first node N1. The first node N1 is connected to the control terminal of the first driving transistor T3 to which the first control signal and the second control signal are inputted. On the output terminal OUT is provided an output capacitor Cout by a load of the gate line G2.

In one implementation, the first capacitor C1 is provided between the output terminal and the control terminal of the first driving transistor T3 and bootstraps a signal of the control terminal of the first driving transistor T3. The first capacitor C1 may be provided as a parasitic capacitor between the gate electrode and the source electrode of the first driving transistor T3, or may be provided as an additional capacitor as necessary. The first driver 230 selectively outputs a clock signal CK inputted to the first clock terminal CK1 according to the first control signal of the first driving controller 210 and the second control signal of the second driving controller 220, thereby generating a gate signal Gout2 of a high level.

In one implementation, the second driver 240 corresponds to a pull-down driver and includes a second driving transistor T4. A drain electrode and a source electrode of the second driving transistor T4 are respectively connected to the output terminal OUT and the base voltage source terminal VSS, and a gate electrode thereof is connected to the second clock terminal CK2. The second driver 240 selectively outputs a gate off voltage Voff inputted to the base voltage source terminal VSS according to the reverse clock signal CKB inputted to the second clock terminal CK2, thereby generating a gate signal of a low level.

In one implementation, the first driving controller 210, the second driving controller 220, the first driver 230 and the second driver 240 correspond to a bootstrap circuit which receives the carry signal Cr1 of the preceding terminal OUT increases output of the output terminal OUT. That is, for example, if a gate signal Gout1 of a gate on voltage Von, that is a carry signal Cr1 is applied to the first driving controller 210, a predetermined voltage is applied to the first node N1 which is the control terminal of the first driving transistor T3 corresponding to the pull-up driver. In this state, if the clock signal CK of a high level is inputted from the first clock terminal CK1, the voltage of the first node N1 is rapidly increased. Accordingly, the bootstrapped voltage is outputted as a gate signal Gout2 of a gate on voltage Von.

Figure 4:
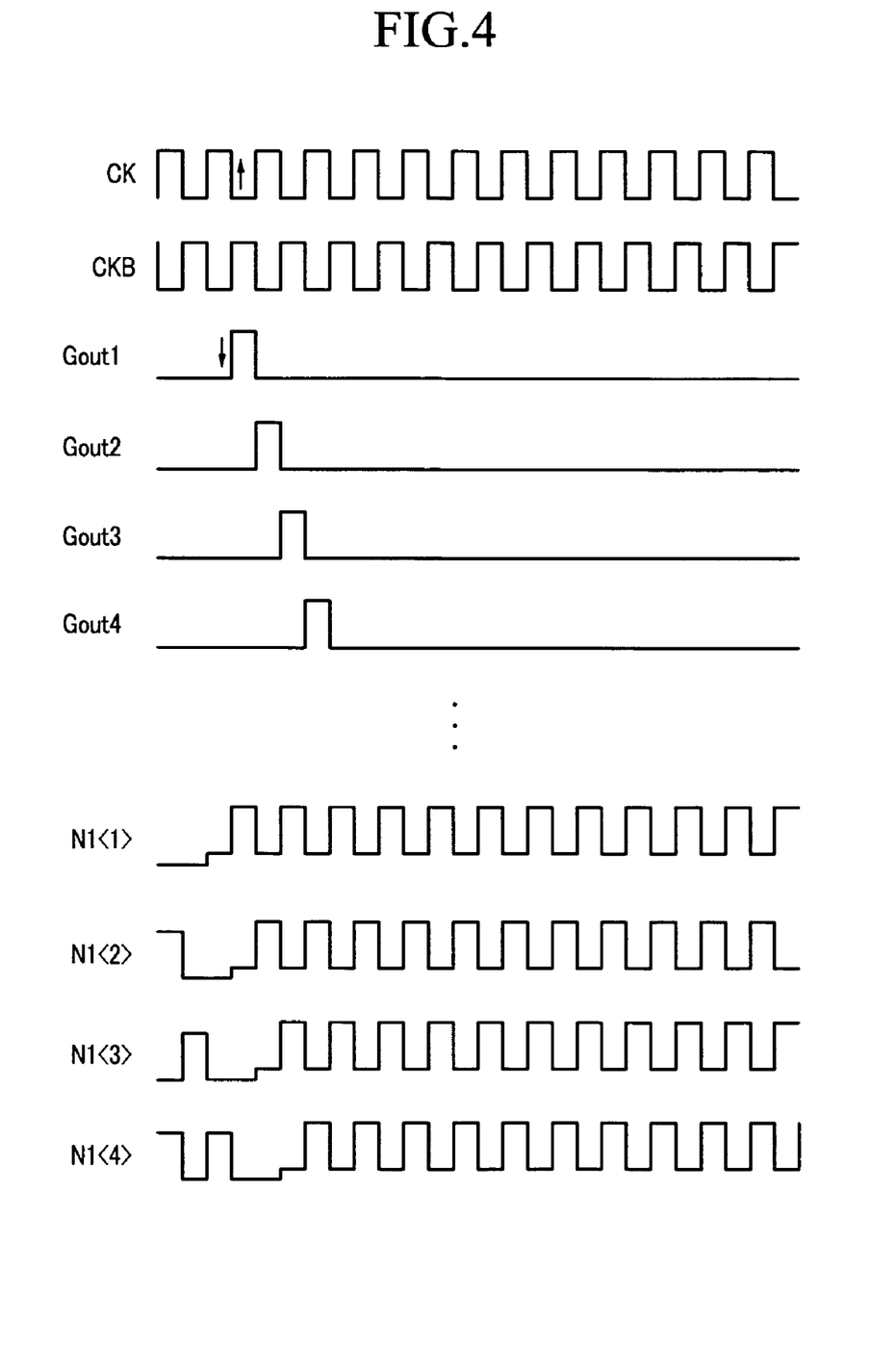
FIG. 4 is a signal waveform diagram of the stage shown in FIG. 3.

FIG. 4 is a signal waveform diagram illustrating the voltage of the first node N1 according to one embodiment of the present disclosure. As shown, a gate signal Gout1 of the first stage SG1 and a gate signal Gout3 of the third stage SG3 are outputted in synchronization with the reverse clock signal CKB of a high level, and the gate signal Gout2 of the second stage SG2 is outputted in synchronization with the clock signal CK of a high level. In one implementation, as described above, the voltage of the first node N1 of the second stage SG2 is increased to a predetermined level while the gate signal Gout1 of the first stage SG1 maintains a high level, a gate on voltage Von. Then, the voltage of the first node N1 is amplified in its level in synchronization with the clock signal CK of the high level.

The sustain part 250 includes, in one embodiment, a first sustain transistor T5, a second sustain transistor T6, a third sustain transistor T8, a fourth sustain transistor T7 and a second capacitor C2. The sustain part 250 sustains gate off of the drivers 230 and the drivers 240 after a gate signal of a high level is outputted to the drivers 230 and the drivers 240. That is, for example, the sustain part 250 stably sustains the gate off voltage Voff of a gate wiring which is turned off after being turned on until in the next frame.

In one implementation, a drain electrode and a source electrode of the first sustain transistor T5 are respectively connected to the output terminal of the first driving transistor T3 and the base voltage source terminal VSS, and a gate electrode thereof is connected to the second node N2. The first sustain transistor T5 outputs a gate off voltage to the output terminal of the first driving transistor T3 according to the voltage applied to the second node N2.

In one implementation, a drain electrode and a source electrode of the second sustain transistor T6 are respectively connected to the control terminal of the first driving transistor T3 and the base voltage source terminal VSS, and a gate electrode thereof is connected to the second node N2. The second sustain transistor T6 outputs a gate off voltage to the control terminal of the first driving transistor T3 according to the voltage applied to the second node N2.

In one implementation, a drain electrode and a source electrode of the fourth transistor T7 are respectively connected to the output terminal of the first driving transistor T3 and the base voltage source terminal VSS, and a gate electrode thereof is connected to the second input terminal IN2. The fourth sustain transistor T7 receives a gate signal of a high level from the third stage SG3 and provides a gate off voltage to the control terminal of the first driver 230.

In one implementation, a third capacitor C3 is connected between the first clock terminal CK1 and the second node N2 and stabilizes the clock signal CK outputted from the first clock terminal CK1 and controls the amplitude of the clock signal CK.

In one implementation, a drain electrode and a source electrode of the third sustain transistor T8 are respectively connected to the second node N2 and the base voltage source terminal VSS, and a gate electrode thereof is connected to a third node N3. The third sustain transistor T8 applies a gate off voltage to the second node N2 according to voltage of the third node N3. The second node N2 is connected to the gate electrodes, that is, for example, the control terminals of the first sustain transistor T5 and the second sustain transistor T6. Accordingly, if a gate off voltage Voff is applied to the second node N2, that is, for example, if the third sustain transistor T8 is turned on, the first sustain transistor T5 and the second sustain transistor T6 sustain a turn off state.

Conventionally, in one example, a control terminal of the third sustain transistor T8 is connected to the first node N1. As described above, the first node N1 is a node where a gate signal is outputted from the first stage SG1 and a clock signal CK is inputted from the first clock terminal CK1. If the first node N1 is connected to the control terminal of the third sustain transistor T8, a threshold voltage Vth of the third sustain transistor T8 is shifted to increase as time passes. That is, for example, the threshold voltage is increased for the same gate-source voltage Vgs. As the threshold voltage becomes higher, a current value flowing in the transistor is decreased, thereby deteriorating a driving performance of the transistor. Further, durability of the gate driver 200 is shortened. The higher a voltage applied to the gate electrode of the transistor becomes and the more intense and the stress that is applied to the gate electrode become, the more a threshold voltage is increased. Also, the longer the voltage is applied to the gate electrode, the more a threshold voltage is increased.

In one embodiment, a gate electrode of the third sustain transistor T8 is separated from the first node N1 to reduce a voltage inputted to the gate electrode of the third sustain transistor T8. In one implementation, the second stage SG2 may further include the first controller 260 for controlling the threshold voltage of the third sustain transistor T8.

The first controller 260 includes, in one embodiment, an input transistor T9, the third capacitor C3, an output transistor T10 and a first stabilizing transistor T11. The input transistor T9 outputs a gate signal outputted from the first stage SG1 to the third node N3 corresponding to the control terminal of the third sustain transistor T8. A control terminal and an input terminal of the input transistor T9 are connected with each other. If a gate signal of a gate on voltage Von from the first stage SG1 is inputted to the first input terminal IN1, a gate on voltage of a high level is applied to the third node N3. The gate on voltage Von is sustained by the third capacitor C3. The third sustain transistor T8 is turned on by the gate on voltage Von of the third node N3, and a gate off voltage Voff is applied to the second node N2.

Thereafter, in one implementation, if a gate signal of a gate on voltage Von from third stage SG3 is inputted from the second input terminal IN2, the output transistor T10 is turned on, and a gate off voltage Voff of a low level is applied to the third node N3. The third node N3 sustains a constant voltage from a gate on time of the first stage SG1 till a gate on time of the third stage SG3. That is, for example, unlike the conventional art, as a clock signal is not inputted to the third node N3, a stress applied to the gate electrode of the third sustain transistor T8 is decreased. As such, an increasing rate of the threshold voltage of the third sustain transistor T8 is decreased and a durability of the third sustain transistor T8 is extended.

The first stabilizing transistor T11 includes, in one embodiment, an input terminal to which a gate off voltage Voff is applied, a control terminal which is connected to the second node N2, and an output terminal which is connected to the third node N3. The first stabilizing transistor T11 stabilizes an initial voltage of the third node N3 and sustains the third node N3 in a steady-state when a gate signal is not inputted from the second input terminal IN2. The first stabilizing transistor T11 may have a smaller capacity than the input transistor T9 or the third sustain transistor T8. Referring to a signal waveform applied to the first controller 260, at a point of time (CK(↑) in FIG. 4) when a gate signal Gout1 inputted to the first input terminal IN1 is increased from a low level to a high level, a clock signal CK applied to the second node N2 through first clock terminal CK1 is decreased from a high level to a low level (Gout1(↓) in FIG. 4). At this time, the third node N2 is in an unstable state that is not a high or low state. Here, if the capacity of the first stabilizing transistor T11 is large, most of a current inputted to the third node N3 flows into the first stabilizing transistor T11. That is, for example, if the capacity of the first stabilizing transistor T11 is large, a gate on voltage Von inputted to the first input terminal IN1 is not fully stored in the third capacitor C3. Accordingly, the capacity of the first stabilizing transistor T11 may be designed to sustain a state of the gate on voltage Von stored in the third capacitor C3.

Figure 5:
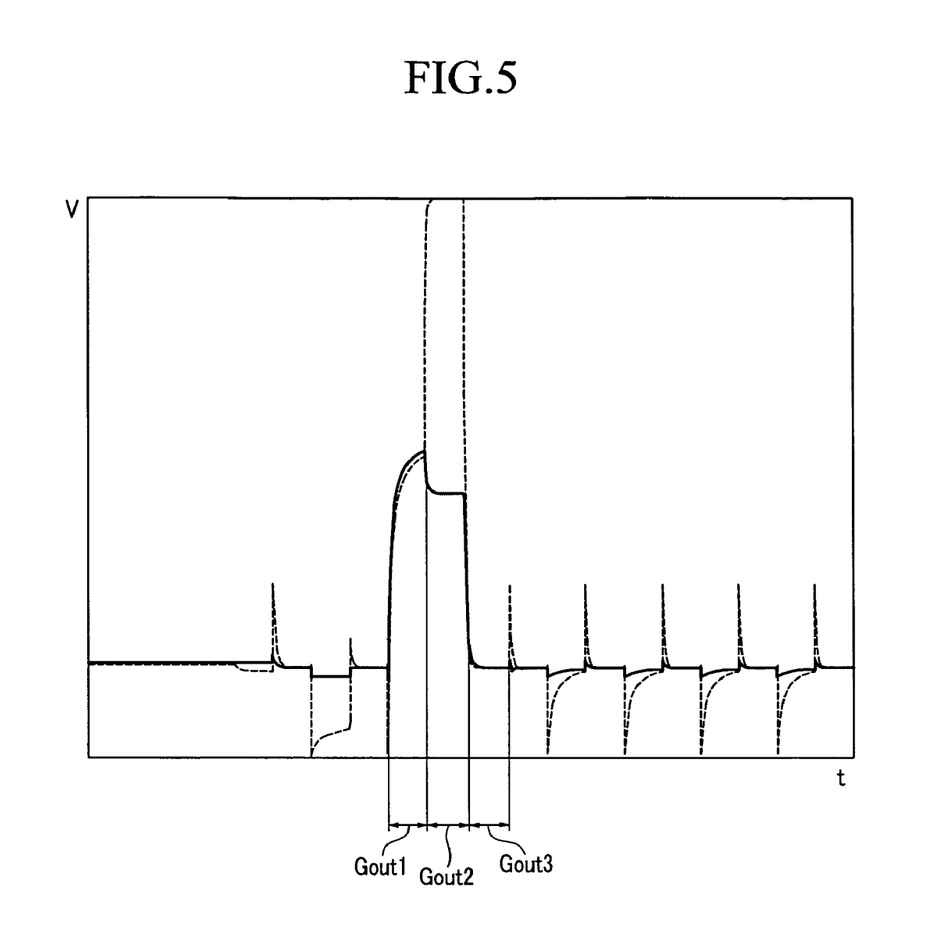
FIG. 5 is a waveform diagram illustrating a voltage of a third node of the stage shown in FIG. 3.

FIG. 5 is a waveform diagram illustrating a voltage of the third node in FIG. 3. A waveform represented by a dotted line is a voltage of the conventional first node N1, and a solid line represents a voltage of the third node N3 according to one embodiment of the present disclosure. As shown, in the waveform shown by the dotted line, the voltage level remains high while a gate signal Gout2 of a gate on voltage Von is outputted from the second stage SG2 after a gate signal Gout1 of a gate on voltage Von is outputted from the first stage SG1. However, in one embodiment of the present invention, while the gate on voltage Gout2 is outputted from the second stage SG2 after the gate on voltage Gout1 is applied from the first stage SG1, the voltage level maintains a low state without increasing and then decreases by a gate on voltage Gout3 outputted from the third stage SG3.

Figure 6:
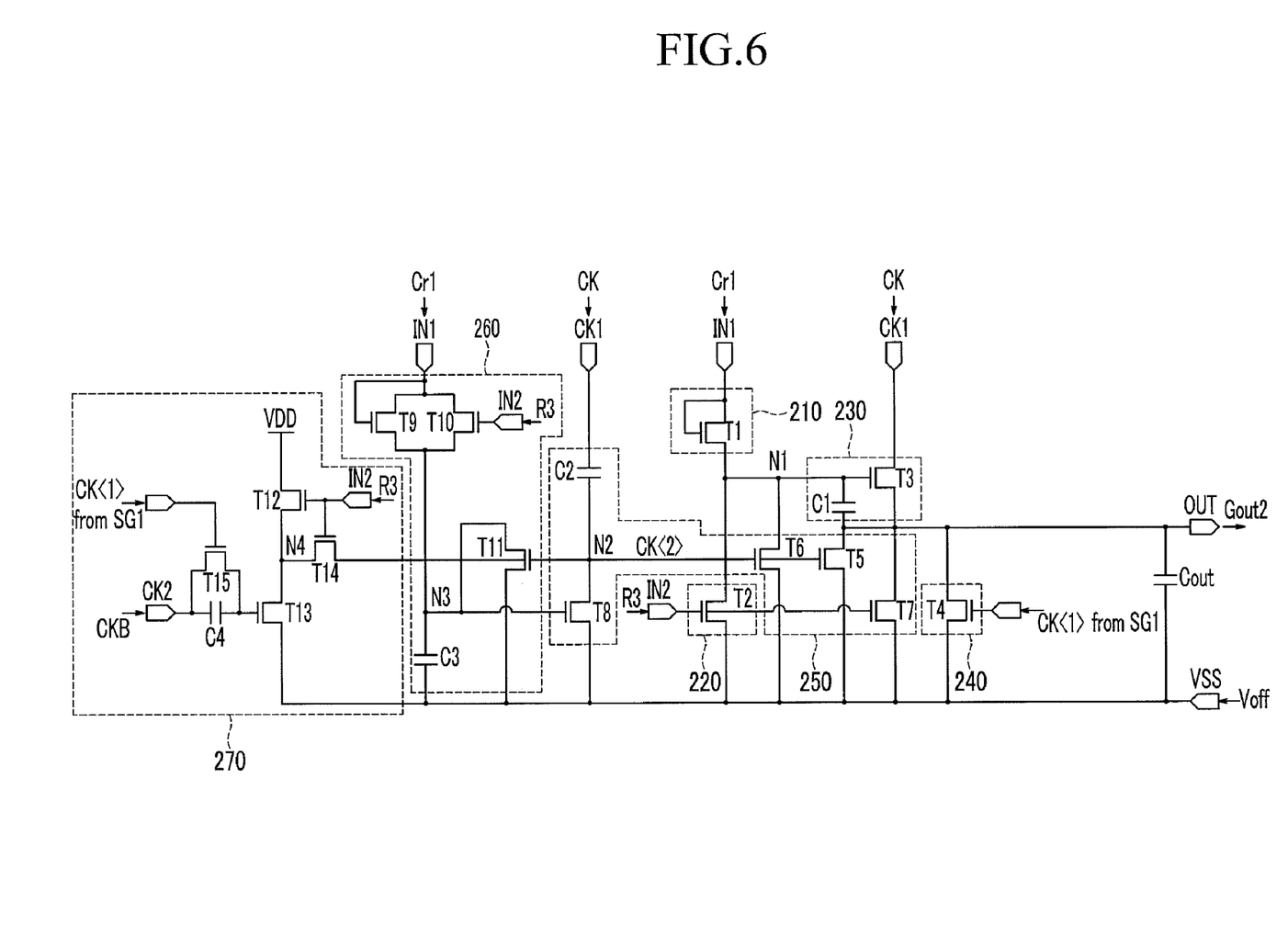
FIG. 6 illustrates a stage of a gate driver according to an exemplary embodiment of the present invention.

FIG. 6 illustrates a stage according to one embodiment of the present invention. The stage according to one embodiment includes a second controller 270 in addition to the stage in FIG. 3. Each stage according to the embodiment is connected to the second node N2 of the previous stage, unlike the construction of FIG. 3.

As shown, control terminals of a first sustain transistor T5 and a second sustain transistor T6 are connected to a second node N2 to which a clock signal CK is inputted. That is, for example, to the second node N2 is applied a stress by the clock signal CK during the time corresponding to a half of one frame. The stress by the clock signal CK increases threshold voltages of the first sustain transistor T5, the second sustain transistor T6 and a first stabilizing transistor T11, thereby deteriorating a reliability of the transistor and shortening the durability thereof. In one embodiment of the present disclosure, a voltage of the second node N2 is increased to cope with the increase of the threshold voltages of the first sustain transistor T5 and the second sustain transistor T6, using the second controller 270. If the voltage of the second node N2 is increased, gate-source voltages Vgs of the first sustain transistor T5 and the second sustain transistor T6 are increased. The amount of decreased current due to increase of the threshold voltage may be compensated for by the increase of the gate-source voltage Vgs, thereby maintaining a driving performance and reliability of the transistor.

In one embodiment, the second controller 270 includes a voltage source terminal VDD, an input transistor T12, a clone transistor T13, and an output transistor T14. A drain electrode and a source electrode of the input transistor T12 are respectively connected to the voltage source terminal VDD and a fourth node N4 and output a voltage applied from the voltage source terminal VDD by a gate signal inputted from a second input terminal IN2.

In one implementation, the clone transistor T13 is serially connected to the input transistor T12 and substantially has the same initial threshold voltage as that of the first sustain transistor T5 and the second sustain transistor T6. A fourth capacitor C4 is connected between a gate electrode of the clone transistor T13 and a second clock terminal CK2 to which a reverse clock signal CKB is inputted. An input terminal and an output terminal of a fifteenth thin film transistor T15 is connected to opposite terminals of the fourth capacitor C4 and to a control terminal thereof is inputted a clock signal CK<1> outputted from a second node N2 of a first stage SG1. The fourth capacitor C4 and the fifteenth thin film transistor T15 are provided to make an initial condition of the clone transistor T13 the same as that of the first sustain transistor T5 and the second sustain transistor T14.

In one implementation, a drain electrode of the output transistor T14 is connected to the fourth node N4; and a source electrode thereof is connected to the second node N2. A gate electrode thereof is connected to the second input terminal IN2 together with the gate electrode of the input transistor T12. If a gate signal is inputted to the second input terminal IN2, the input transistor T12 and the output transistor T13 are turned on, and a voltage of the voltage source terminal VDD is supplied. A voltage of the second node N2 is determined by a ratio of resistances and capacitances of the input transistor T12 and the clone transistor T13; and the voltage applied to the second node N2 is inputted to the control terminal of the first sustain transistor T5 and the second sustain transistor T6.

As time passes, in one implementation, the threshold voltages of the first sustain transistor T5 and the second sustain transistor T6 are increased and the clone transistor T13 deteriorates, causing a shift in the threshold voltage of the clone transistor T13. If the threshold voltage of the clone transistor T13 is increased, the amount of current flowing to the clone transistor T13 is decreased and a resistance value of the clone transistor T13 is increased. That is, for example, as time passes, a voltage of the fourth node N4 is increased, and accordingly, a voltage of the second node N2 is increased. As the voltage applied to the second node N2 is gradually increased, gate-source voltages Vgs of the first sustain transistor T5 and the second sustain transistor T6 are increased. A clock signal CK<2> outputted from the second node N2 is similar in amplitude to a clock signal CK inputted from a first clock terminal CK1, but an absolute value of a voltage level thereof is increased compared with the clock signal CK. That is, for example, the clock signal CK<2> outputted from the second node N2 may positively cope with a change of the threshold voltage.

A control terminal of the second driving transistor T4, according to one embodiment of the present disclosure, is connected to the second node N2 of the first stage SG1 to be supplied with a signal CK<1> of the second node N2, not to a second clock terminal CK2 to which the reverse clock signal CKB is inputted. A clock signal CK outputted from the first stage SG1 which is the preceding stage functions as a reverse clock signal CKB to a second stage SG2. A control terminal of the second driving transistor T4 to which a stress is continuously applied, like the first sustain transistor T5 and the second sustain transistor T6, is connected to the second node N2 of the first stage SG1, thereby increasing the gate-source voltage Vgs of the second driving transistor T4.

Figure 7:
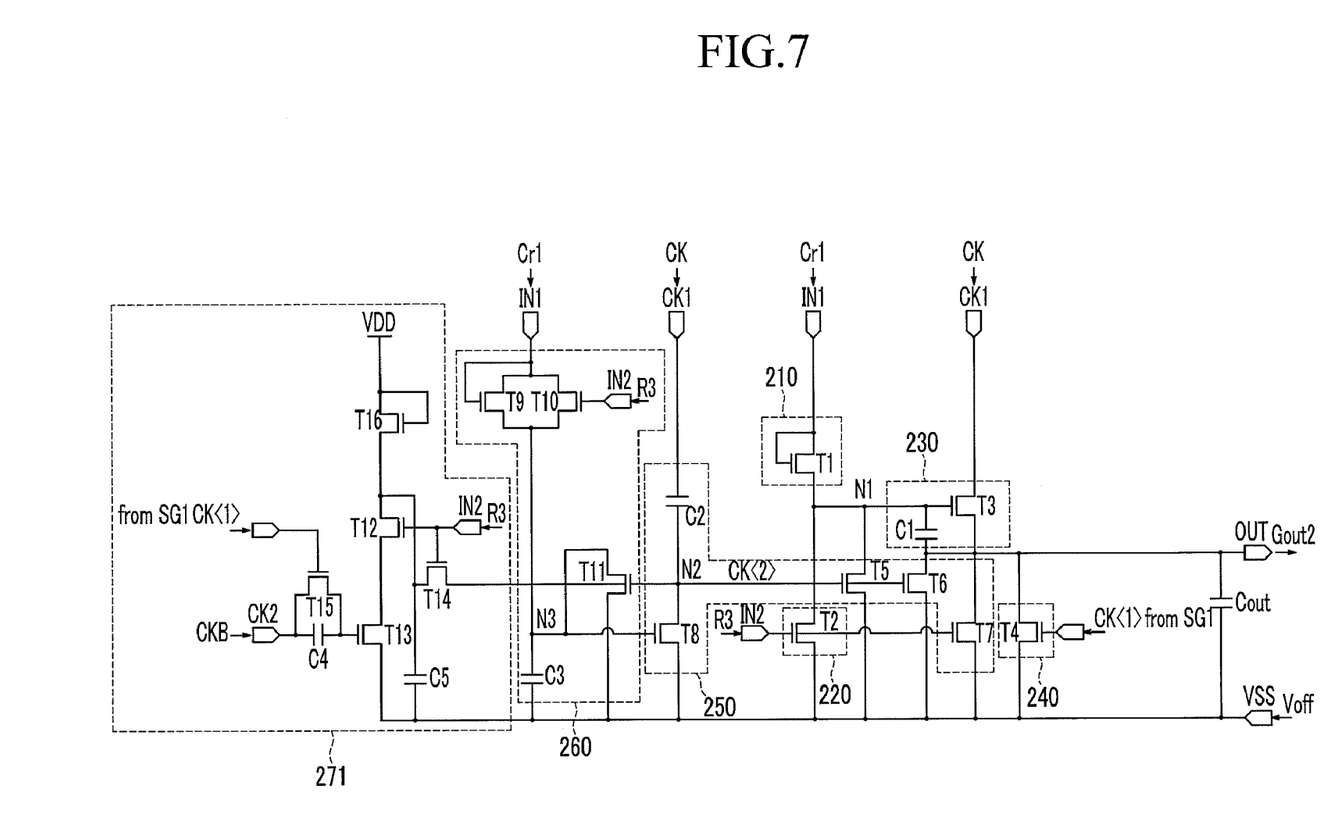
FIG. 7 illustrates a stage of a gate driver according to an exemplary embodiment of the present invention.

FIG. 7 illustrates a stage according to one embodiment of the present disclosure. A second controller 271, in one embodiment, includes a second stabilizing transistor T16 and a fifth capacitor C5. The second stabilizing transistor T16 is connected between a voltage source terminal VDD and an input transistor T12 and stabilizes a voltage supplied from the voltage source terminal VDD and also stabilizes a fifth node N5 to which an output transistor T14 is connected. The fifth capacitor C5 is connected between the fifth node N5 and a base voltage source terminal VSS and stabilizes a voltage of the fifth node N5. The fifth capacitor C5 may be connected between the voltage source terminal VDD and the base voltage source terminal VSS.

A drain electrode of the output transistor T14, according to one embodiment of the present disclosure, is connected to the fifth node N5. Alternatively, the drain electrode of the output transistor T14 may be connected between the input transistor T12 and a clone transistor T13. In one implementation, the voltage source terminal VDD in FIG. 6 and FIG. 7 may be connected to the second clock terminal CK2 that receives the reverse signal CKB.

Figure 8:
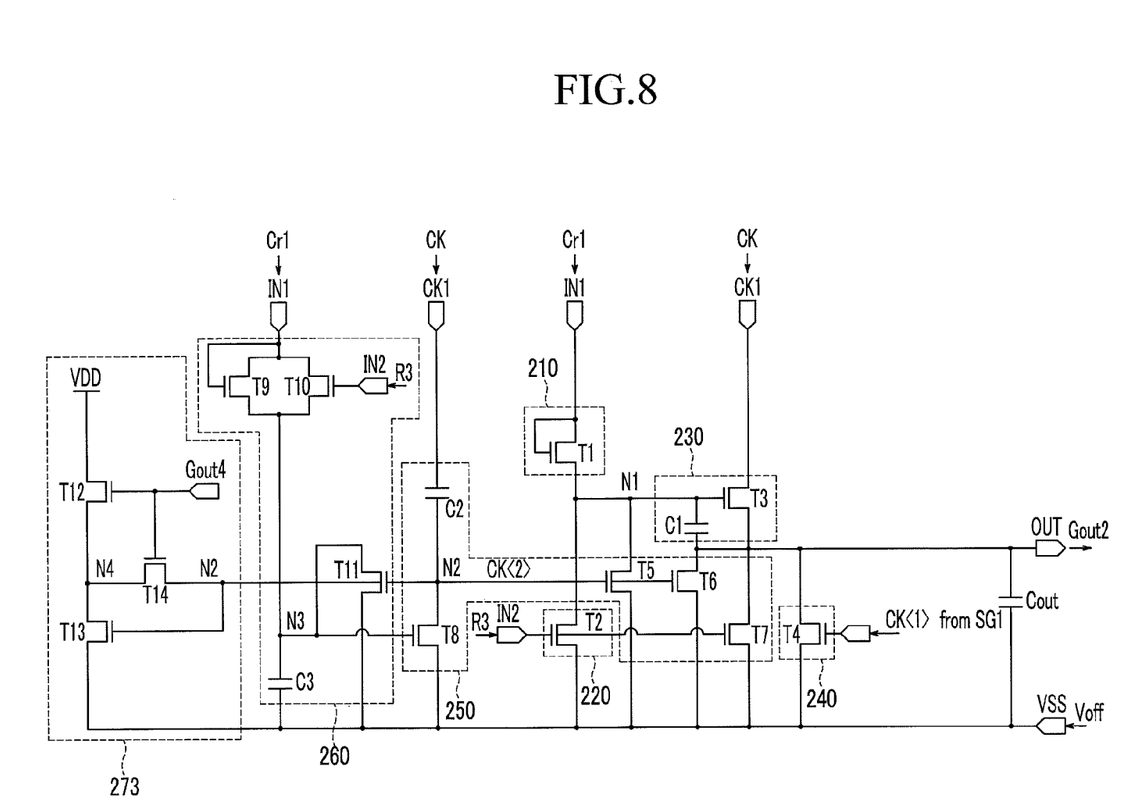
FIG. 8 illustrates a stage of a gate driver according to an exemplary embodiment of the present invention.
Figure 9:
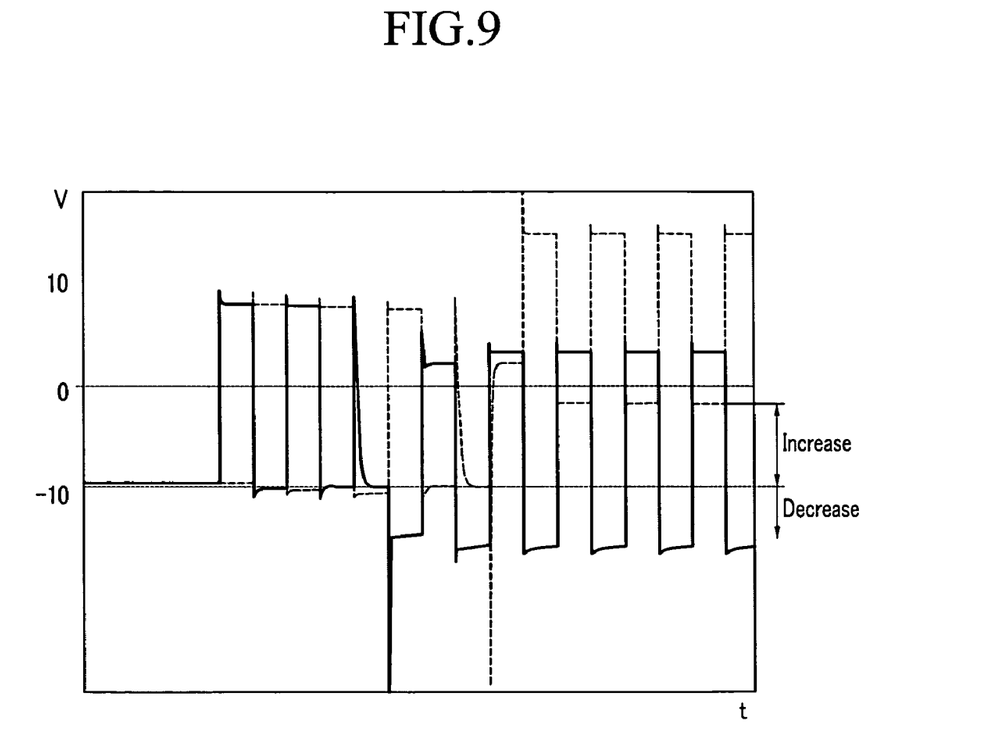
FIG. 9 is a waveform diagram illustrating a voltage of a second node of the stage shown in FIG. 8.

FIG. 8 illustrates a stage according to one embodiment of the present disclosure, and FIG. 9 is a waveform diagram illustrating a voltage of a second node. As shown in FIG. 8, in one embodiment of a second controller 273, a control terminal of a clone transistor T13 is connected to the second node N2.

In the second controller 270 or 271 in FIG. 6 or FIG. 7, driving environments of the clone transistor T13, the first sustain transistor T5 and the second sustain transistor T6 become different over time. The clock signal CK<1> inputted to the control terminals of the first sustain transistor T5 and the second sustain transistor T6 changes with time, whereas the reverse clock signal CKB connected to the clone transistor T13 stays at a constant level. Thus, stresses applied to the control terminals of the transistors T5, T6 and T13 become different gradually.

The second controller 273, in one embodiment, connects the control terminals of the first and second sustain transistors T5 and T6 and the control terminal of the clone transistor T13 to each other, to thereby feed the clock signal CK<2> applied to the first and second sustain transistors T5 and T6 to the clone transistor T13.

Assuming that a current flowing in the input transistor T12 is 1 and a relative current flowing into the clone transistor T13 with respect to the current of 1 is x, an initial voltage Vinitial is as follows:

$$Vinitial \approx Vth + \frac{VDD - Vth}{1 + x} \quad \text{[Formula 1]}$$

The initial voltage Vinitial refers to a voltage at the second node N2 before outputting the gate signal to the output terminal OUT. The Vinitial is the low level of the clock signal CK<2> outputted from the second node N2. That is, for example, the amplitude of the clock signal CK<2> increases from the level of the Vinitial.

A threshold voltage Vth of the clone transistor T13 is continuously applied to the second node N2 due to a feedback circuit and the term (VDD−Vth)/(1+x) is added thereto, thereby causing a problem that the initial voltage Vinitial becomes excessively high before deterioration of the transistor is generated.

In one implementation, if the control terminals of the input transistor T12 and the output transistor T14 are connected to the second input terminal IN2 to which the gate signal Gout3 of the third stage SG3 is applied, a clock signal CK is applied to the second node N2 after the gate signal Gout3 is applied. That is, for example, the gate signal Gout<3> is used as the low level of the clock signal CK, and then, a voltage of the second node N2 further increases while the clock signal CK rises to a high level.

Thus, the second controller 271, in one embodiment, connects the control terminals of the input transistor T12 and the output transistor T14 to the output terminal of the fourth stage SG4, not to the third stage SG3. A gate signal Gout4 outputted from the fourth stage SG4 is applied to the second node N2 as the high level of the clock signal CK. Then, the clock signal CK decreases to the low level to thereby decrease the voltage of the second node N2.

In FIG. 9, a waveform represented by a dotted line is a voltage of the conventional second node N2 in case that the control terminals of the input transistor T12 and the output transistor T14 are connected to the output terminal of the third stage SG3, and a solid line represents a voltage of the second node N2 according to one embodiment of the present invention. In the case of the dotted line, a voltage of the second node N2 is generally increased according to the clock signal CK after the gate signal is applied. In this case, the low level of the clock signal CK<2> outputted from the second node N2 is higher than the low level of the clock signal CK outputted from the first clock terminal CK1. In the case that an initial voltage of the second node N2 is higher than a threshold voltage of the transistor before deterioration of the transistor, the first sustain transistor T5 and the second sustain transistor T6 may not be turned off even if the low level were applied.

On the other hand, the solid line shows that the level of the clock signal CK<2> outputted from the second node N2 is generally decreases. The high level of the clock signal CK<2> outputted from the second node N2 is a little higher than 0V. The initial voltage gradually increases due to decrease of x as time passes (refer to [Formula 1]). In summary, the voltage level of the second node N2 before deterioration of the transistor is generated generally decreases, and then, gradually increases due to the deterioration of the transistor.

Figure 10:
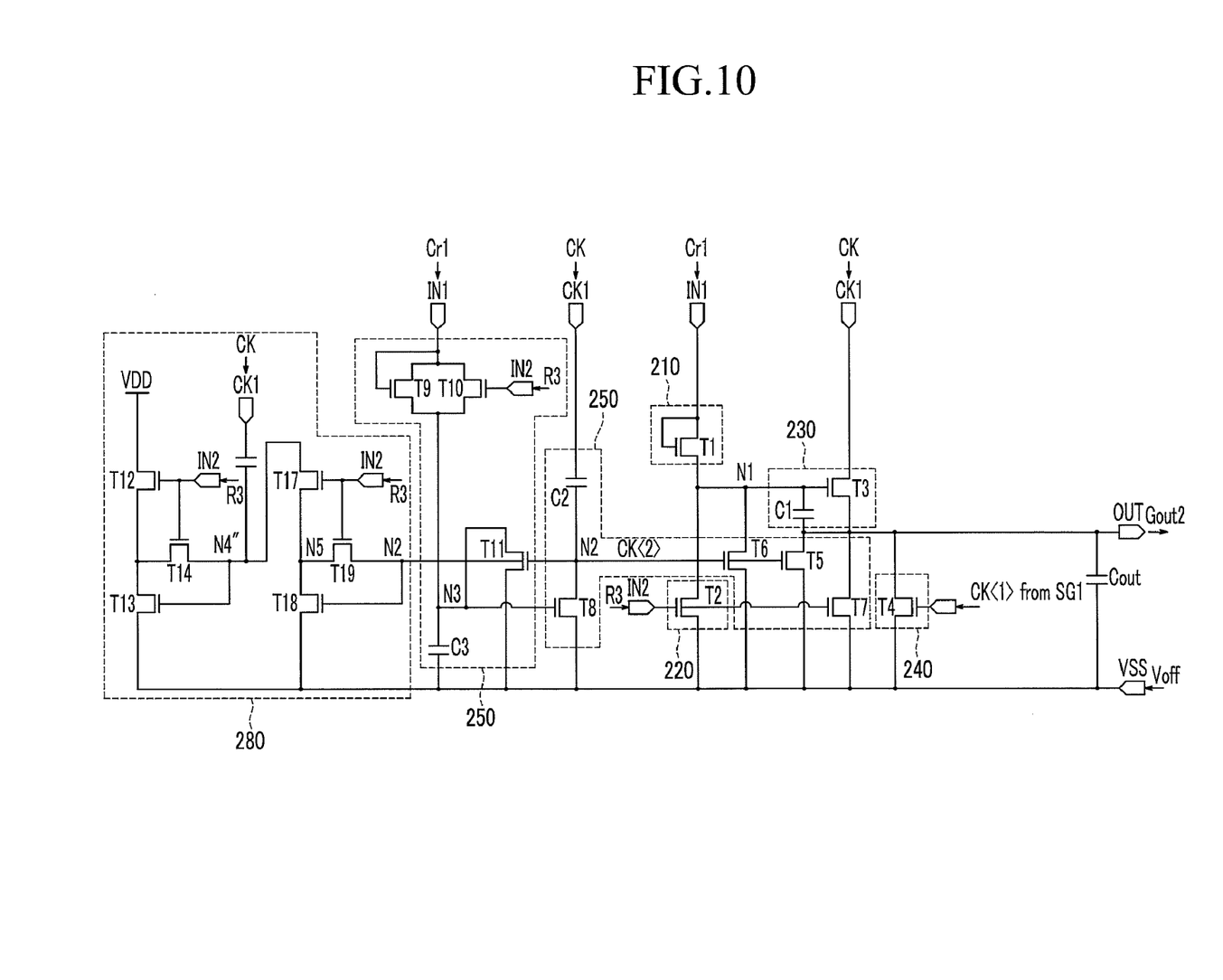
FIG. 10 illustrates a stage according to an exemplary embodiment of the present invention.
Figure 11:
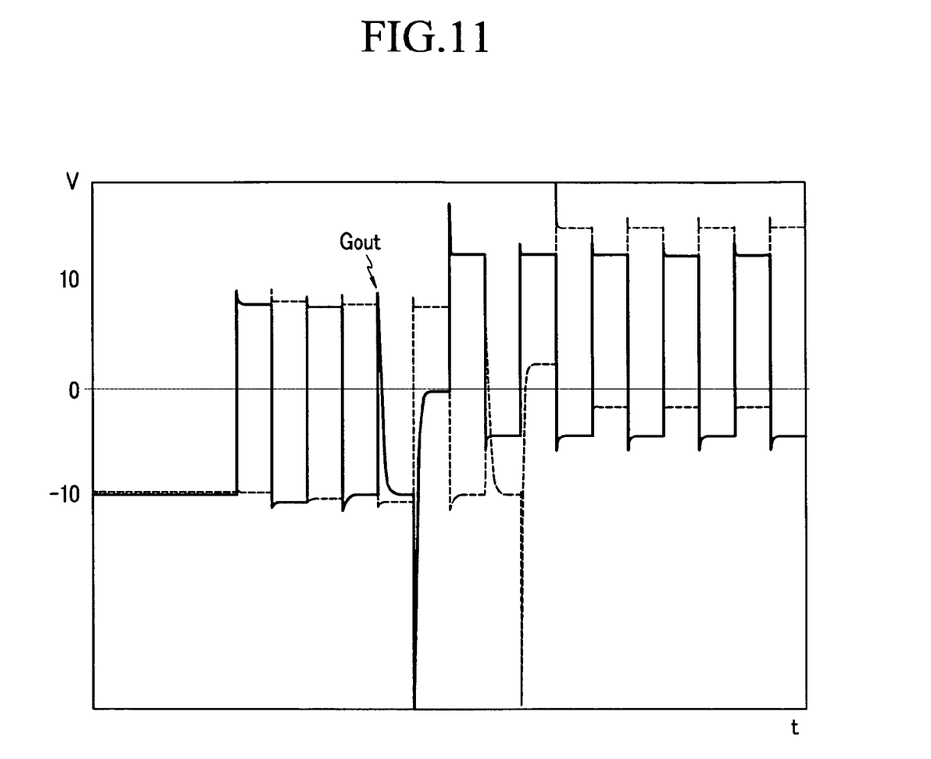
FIG. 11 is a waveform diagram illustrating a voltage of a second node of the stage shown in FIG. 10.

FIG. 10 illustrates a stage according to one embodiment of the present disclosure. FIG. 11 is a waveform diagram according to one embodiment of the present disclosure. As shown, a third controller 280 has a configuration similar to the second controller 273 in FIG. 8. That is, for example, the third controller includes two second controllers 273 are serially connected each other. To a first input transistor T12, a first clone transistor T13 and a first output clone transistor T14 which are connected to a voltage source terminal VDD are connected a second input transistor T16, a second clone transistor T17 and a second output clone transistor T18 which have the same patterns as the first input transistor T12, the first clone transistor T13 and the first output clone transistor T14. A fourth node N4" corresponds to the second node N2 in FIG. 8. The stage includes, in one embodiment, a feedback loop spanning two stages. Here, for example, a gate signal Gout3 outputted from the third stage SG3 is inputted to the control terminals of the input transistors T14 and T18.

An initial voltage Vinitial applied to the second node N2, according to one embodiment of the present disclosure, is as follows:

$$Vinitial \approx Vth + \frac{\left(\frac{VDD - Vth}{1 + x} + Vth\right) - Vth}{1 + x} \quad \text{[Formula 2]}$$
$$= Vth + \frac{\frac{VDD - Vth}{1 + x}}{1 + x}$$
$$= Vth + \frac{VDD - Vth}{(1 + x)^2}$$

Due to the term $1/(1+x)^2$, the initial voltage Vinitial in [Formula 2] is smaller than that in [Formula 1].

In one implementation, a dotted line in FIG. 11 represents a signal waveform in the case of a single controller in which the control terminals of the input transistor T12 and the output transistor T14 are connected to the output terminal of the third stage SG3. That is, for example, the signal waveform shown in dotted line in FIG. 11 is the same as that represented by the dotted line in FIG. 9. As for the solid line in FIG. 11, it represents a voltage of the second node N2 in the case of two controllers that are connected to each other according to one embodiment of the present disclosure. Here, for example, it may be seen that increase in the initial voltage is lowered compared to the case shown by the dotted line. Similarly, three or more controllers may be connected to each other as necessary, which may further lower the increase in the initial voltage.

In one implementation, as described above, the present invention may be suitably adapted to a threshold voltage of the transistor included in the gate driver 200, to thereby lengthen the lifespan of the gate driver 200 and enhance its driving performance. In another implementation, as described above, the present invention provides a gate driving circuit which may positively cope with a change in a threshold voltage of a transistor to thereby improve its driving performance and extend its lifespan, and a display device including the same.

Although a few exemplary embodiments of the present disclosure have been shown and described, it will be appreciated by those skilled in the art that changes may be made in these embodiments without departing from the principles and spirit of the disclosure, the scope of which is defined in the appended claims and their equivalents.

What is claimed is:

1. A display device comprising:
   a display panel in which a gate lines are formed; and
   a gate driving circuit which is connected to the gate lines and outputs a gate signal,
   wherein the gate driving circuit comprises:
   a first stage;
   a second stage electrically coupled to the first stage; and
   a third stage electrically coupled to the second stage, and
   wherein the second stage comprises:
   a driving controller which generates a first control signal and a second control signal upon receiving gate signals applied from the first stage and the third stage;
   a driver which outputs a gate signal of a high level according to the first control signal and the second control signal;
   a sustain part comprising at least one sustain transistor for sustaining a gate-off voltage of the driver after the gate signal is outputted from the driver; and
   a controller for controlling a threshold voltage of the sustain transistor,
   wherein the controller comprises:
   an input transistor configured to output a gate signal outputted from the first stage to a predetermined third node;
   a third capacitor which is connected between the third node and a base voltage source terminal to which a gate off voltage is to be applied; and
   an output transistor comprising an input terminal to which the gate signal outputted from the first stage is to be inputted, a control terminal to which a gate signal from the third stage is to be inputted, and an output terminal which is connected to the third node.

2. The display device of claim 1, wherein the driving controller comprises:
   a first driving controller comprising a control terminal to which a gate signal of the first stage is applied and an output terminal which outputs the first control signal by the gate signal applied to the control terminal; and
   a second driving controller comprising an input terminal to which the gate off voltage is inputted, a control terminal to which a gate signal from the third stage is applied, and an output terminal which outputs the gate off voltage as the second control signal by the gate signal,
   wherein the driver comprises:
   a first driving transistor comprising an input terminal to which a clock signal is inputted, a control terminal to which the first control signal and the second control signal are applied, and an output terminal which outputs the clock signal as a gate signal of a high level by the first control signal and the second control signal; and a first capacitor which is provided between the output terminal and the control terminal of the first driving transistor and bootstraps the control terminal.

3. The display device of claim 2, wherein the sustain part comprises:
a first sustain transistor comprising an input terminal to which a gate off voltage is inputted, a control terminal which is connected to a predetermined second node, and an output terminal which outputs the gate off voltage to the output terminal of the first driving transistor according to a signal inputted to the control terminal;
a second sustain transistor comprising an input terminal to which a gate off voltage is inputted;
a control terminal which is connected to the second node, and an output terminal which applies the gate off voltage to a first node corresponding to the control terminal of the first driving transistor according to a signal inputted to the control terminal;
a second capacitor which is connected between a clock terminal to which the clock signal is inputted and the second node; and
a third sustain transistor which comprises an input terminal to which a gate off voltage is inputted and an output terminal which is connected to the second node and applies the gate off voltage to the second node according to a signal inputted to a control terminal thereof.

4. The display device of claim 3, wherein the sustain part further comprises a fourth transistor comprising an input terminal to which a gate off voltage is applied, a control terminal to which a gate signal from the third stage is applied, and an output terminal which applies the gate off voltage to the output terminal of the first driving transistor according to the gate signal.

5. The display device of claim 1, wherein the third node corresponds to the control terminal of the third sustain transistor.

6. The display device of claim 5, wherein the controller further comprises a first stabilizing transistor comprising an input terminal to which a gate off voltage is inputted, a control terminal which is connected to the second node, and an output terminal which is connected to the third node.

7. A gate driving circuit comprising:
a first stage;
a second stage electrically coupled to the first stage; and
a third stage electrically coupled to the second stage,
wherein the second stage comprises:
a first driving controller which generates a first control signal by a gate signal applied from the first stage;
a second driving controller which generates a second control signal by a gate signal applied from the third stage;
a driver which outputs a gate signal of a high level according to the first control signal and the second control signal;
a sustain part comprising at least one sustain transistor for sustaining a gate-off voltage of the driver after the gate signal is outputted from the driver; and
a controller for controlling a threshold voltage of the sustain transistor,
wherein the controller comprises:
an input transistor configured to output a gate signal outputted from the first stage to a predetermined third node;
a third capacitor which is connected between the third node and a base voltage source terminal to which a gate off voltage is to be applied; and
an output transistor comprising an input terminal to which the gate signal outputted from the first stage is to be inputted, a control terminal to which a gate signal from the third stage is to be inputted, and an output terminal which is connected to the third node.

* * * * *